United States Patent [19]
Percic

[11] Patent Number: 4,542,979
[45] Date of Patent: Sep. 24, 1985

[54] METHOD AND APPARATUS FOR FORMING A MULTICOLOR PROOF PRINT

[75] Inventor: Milan Percic, Noord-Brabant, Netherlands

[73] Assignee: Coulter Stork Patents B.V., Amsterdam, Netherlands

[21] Appl. No.: 527,651

[22] PCT Filed: Dec. 14, 1982

[86] PCT No.: PCT/EP82/00265
§ 371 Date: Aug. 11, 1983
§ 102(e) Date: Aug. 11, 1983

[51] Int. Cl.[4] .................. G03G 15/01; G02B 27/17; G03G 13/22
[52] U.S. Cl. .................................. 355/4; 430/43; 430/44; 430/45
[58] Field of Search ............... 355/4; 430/43, 44, 45, 430/47, 126

[56] References Cited
U.S. PATENT DOCUMENTS

| | | | |
|---|---|---|---|
| 3,836,244 | 9/1974 | Lehman | 355/4 X |
| 3,836,363 | 9/1974 | Plutchak | 355/4 X |
| 3,998,539 | 12/1976 | Kidd | 355/4 |
| 3,999,987 | 12/1976 | Davis et al. | 430/44 |
| 4,120,577 | 10/1978 | Watanabe et al. | 355/4 |
| 4,204,728 | 5/1980 | Goshima et al. | 355/4 |
| 4,230,405 | 10/1980 | Kurtz | 355/4 |
| 4,234,350 | 11/1980 | Mailloux et al. | 355/4 |

Primary Examiner—A. T. Grimley
Assistant Examiner—Terry Flower
Attorney, Agent, or Firm—Silverman, Cass & Singer, Ltd.

[57] ABSTRACT

A method and apparatus for electrophotographically forming a multi-color proof print using at least two color separations. Two toner images of different color are formed in registration with each other. The photoconductive coating for each toner image is charged to an identical final charge state. Development of the charge pattern on each color separation is commenced after correspondingly identical time periods.

46 Claims, 13 Drawing Figures

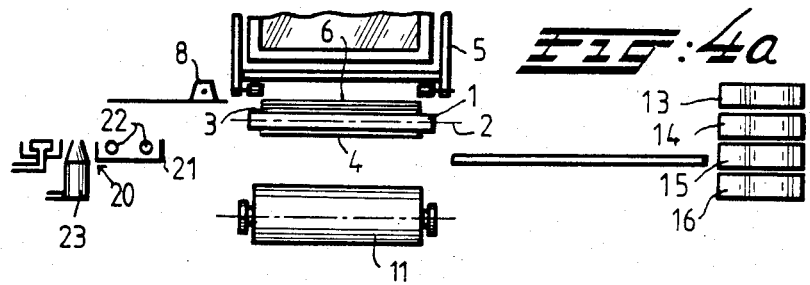
FIG: 4a
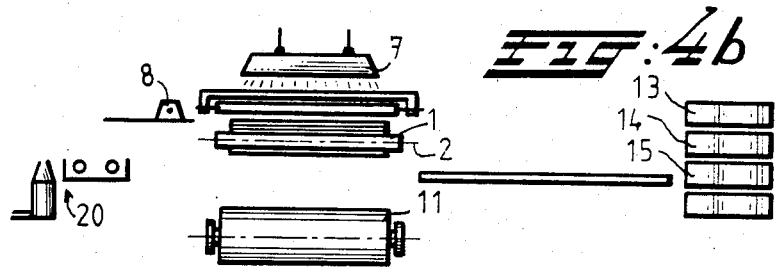
FIG: 4b
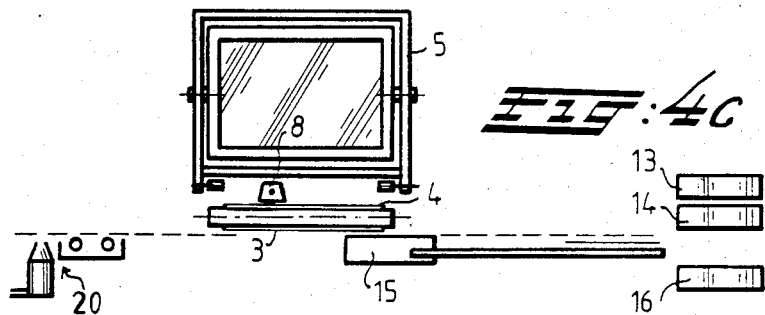
FIG: 4c
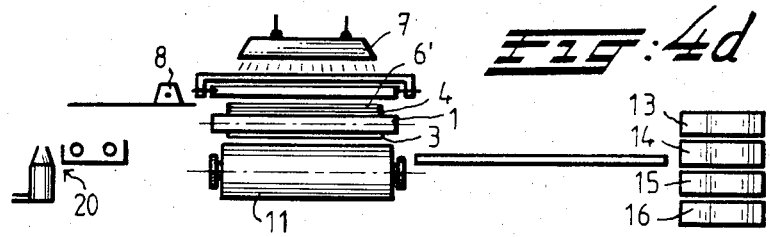
FIG: 4d
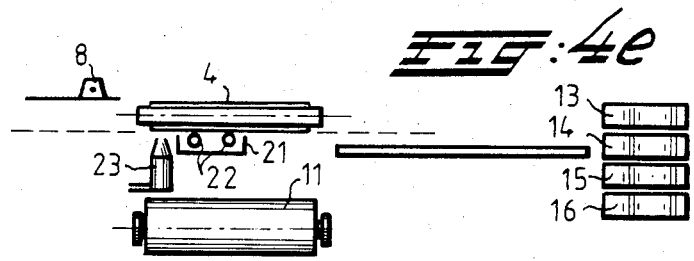
FIG: 4e

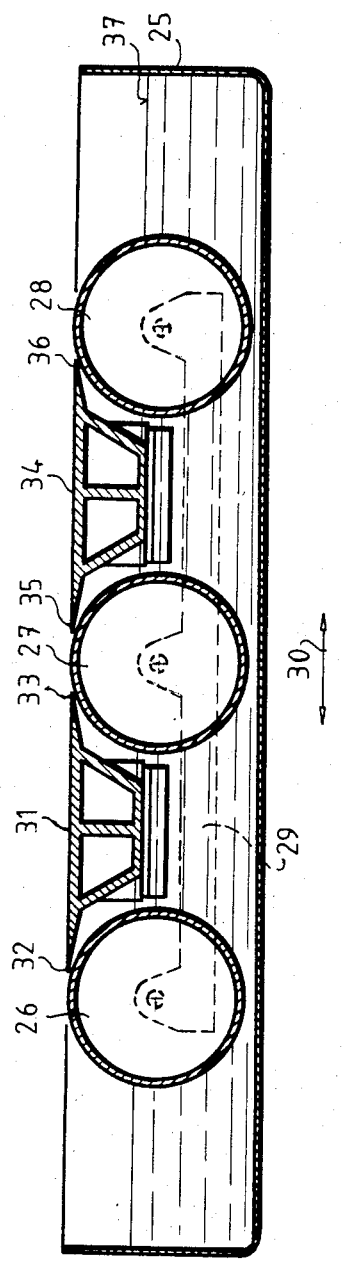

METHOD AND APPARATUS FOR FORMING A MULTICOLOR PROOF PRINT

BACKGROUND OF THE INVENTION

1. Field of the Invention

This invention relates generally to xerography and more particularly, to a method and apparatus for forming a multicolor proof print from at least two light transmitting color separations.

2. Description of the prior art

It is known in multi-color printing to make use of color separations, i.e. partial images in each of the three basic colors (yellow, magenta, cyanogen) usually supplemented with a partial image in black. Different techniques are known for obtaining such color separations from the original to be reproduced. Before commencing the final production printing run of such separations, a check must be made to ensure that a satisfactory final result is obtained with the color separations formed. For this purpose, a proof print normally is made on a proof printing press. This is a time-consuming process. Furthermore, the proof printing press required for such procedure is expensive.

The general state of the art with which the present invention is concerned is described in U.S. Pat. Nos. 3,999,987 and 3,836,244. Additionally, U.S. Pat. No. 4,120,577 describes the problems which occur when making color reproductions as a result of the charge which remains on the electrophotographic material after exposure and supply of toner. Said U.S. Pat. No. 4,120,577 teaches removal of the residual charge by use of a special corona-electrode. In the present invention, such residual charge is removed by an extra exposure step.

The present invention provides a method and apparatus for forming a multi-color print in a quick and inexpensive manner and in which the print corresponds so much with the print formed on a printing press that it is possible to make a very accurate assessment of the color separations.

SUMMARY OF THE INVENTION

The method of the invention is characterized by the formation of a charge pattern from each color separation by exposure of a photoconductive coating which has been charged in advance to a certain charge level. The charge pattern is developed a predetermined period of time after the charge state has been achieved. Toner is used having a color which corresponds with the color separation concerned. The toner image thus obtained is transferred onto a receptor surface such that the second and subsequent toner images are in registration with the preceding ones. The photoconductive coating for each of the partial images is charged up to an identical final charge state; the development with toner starts after the coating has achieved the final charge state, which is identical for all partial images.

The present invention is based on the knowledge that fully reproducible and comparable results are obtained if development of the respective partial images starts at an identical point on the darkness decay curve of the corresponding coating. This point is essentially the commencement of development after a period which is identical for all partial images after the final charge state has been achieved. In actual practice, it has been observed that results are obtained which closely match those obtained with a proof print. It is less expensive to construct a device for performing the method of the invention than a proof printing machine.

In the present invention, charging and development of the coating preferably is undertaken during a period which is identical for all of the respective toner partial images. Preferably, several coatings having mutually identical characteristics are used for the formation of the respective partial images. Charging of a photoconductive coating is undertaken during the period of development of the coating which has been charged up and exposed with a partial image of a different color immediately prior thereto.

DESCRIPTION OF THE DRAWING

FIGS. 4a to 4e show the positions and movements of the different constituent components with respect to each other;

FIG. 5 is a schematic side view, partially in section, of a toner holder employed in accordance with the invention;

DESCRIPTION OF THE PREFERRED EMBODIMENTS

Figure 1:
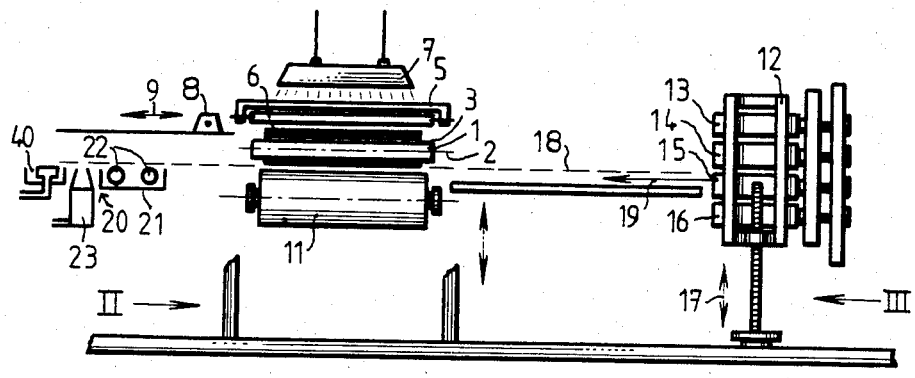
FIG. 1 shows a schematic frontal view of the mutual position of the different constituent parts of the arrangement in accordance with the invention.

When preparing a series of proof prints from the same originals using coatings sensitive to glare phenomena the exposures for a certain color separation preferably are effected with equal light quantities throughout the series.

When performing the method of the invention with certain types of photoconducting coatings, such as zinc oxide coatings, the quality of the toner image is improved when the coating is moistened with a toner dispersant prior to the application of toner.

To obtain good results, it is advantageous to moisten the surface of the photoconductive coating with a suitable solvent after transfer of the toner to the receptor surface and prior to further charging of the photoconductive coating. Thereafter, the applied solvent is sucked off. Any residual charge on the photoconductive coating will flow away after transfer of the toner to the receptor surface and prior to further charging of the photoconductive coating. As a result, the respective consecutive images all are of high quality. The quality is even better if, prior to transfer of toner, the receptor surface is moistened and thereafter dried after transfer of toner.

The apparatus of the invention is characterized by a housing which retains a flat support for a photoconductive coating. Means are provided for charging and exposure of the coating. Means also are provided for transferring to a receptor surface a toner image obtained by interaction of the coating with one of a number of toner holders which are provided with toner application means. The toner holders are movable individually for inter-action between the coating and a selected toner holder.

The structure of the invention provides a compact construction and the movement of the various parts described with respect to each other can be achieved by simple guides and controls.

In a preferred embodiment of the apparatus, the support can be moved from an initial position around a fixed axis positioned parallel with respect to the support surface. The coating can be charged and exposed when the surface is in the initial position. The support is movable to a second position which is rotated 180° with respect to the initial position. The exposed surface can be provided with toner from one of the toner holders located one above the other in a magazine. A drive mechanism is provided to move a selected toner holder out of the magazine into a path which extends along the support and return the holder back into the magazine.

Preferably, the apparatus is such that the support carries a photoconductive coating on both surfaces. The support is positioned horizontal in its two positions, and the charging and exposure means are located above the level of the support shaft, and the toner and image transfer means are located thereunder.

The horizontal location of the support having the photoconductive coatings and the arrangement described above of the means interacting therewith provides a compact construction and especially facilitates the supply of toner to the exposed photoconductive coating.

In an alternate embodiment, each toner holder is closed at the top by a flat plate having at least two slots located transverse to the direction of movement of the holder. The level of the plates coincides with that of the outer surface of a toner transport roller mounted in the holder. The rollers are driven in rotary fashion in a direction opposite to that of movement of the holder. Toner is applied by the rollers to respective plates from the holder during said rotation. The plate is electrically isolated with respect to the support and, in order to function as a developing electrode, can be brought to a selected electrical potential with respect to the support. Satisfactory and uniform application of the toner is facilitated if the rollers can be displaced over a short distance transverse to the axial direction thereof.

A further embodiment of the invention is characterized by a doctor blade which cleans the flat top plate of the toner holder at the end of the toner application movements.

It is preferable that the toner which remains on the photoconductive coating after image transfer is removed; for this purpose use can be made of one or several solvent discharge and suction nozzles having their discharge aperture facing upwards. The nozzles cover the width of the coating and are retained in an essentially horizontal plane in a frame which can move back and forth underneath the coating.

The apparatus also includes a solvent holder which can move back and forth in a horizontal direction underneath the coating. One or more application rollers are provided which project a short distance from the upper surface of the coating. The rollers are driven in rotary fashion and connected with a narrow overflow chamber which passes over the photoconductive coating and which is open at the top. The overflow chamber is connected to a solvent feed pipe that is accommodated in and projects from a holder provided with a liquid outlet and a suction nozzle which passes over the photoconductive coating.

Figure 2:
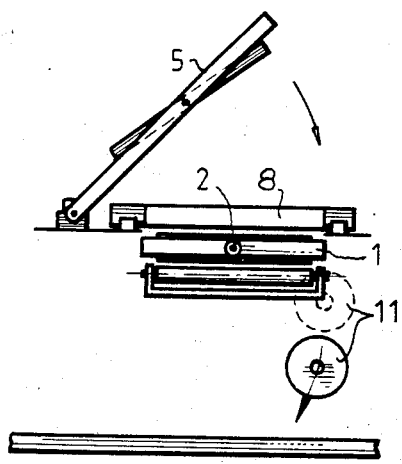
FIG. 2 provides a view in the direction of the arrow 2.
Figure 3:
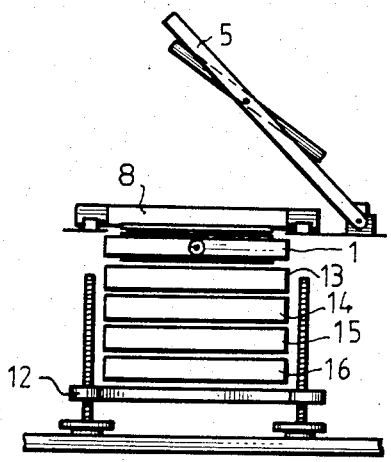
FIG. 3 provides a view in the direction of the arrow 3.

Referring to the drawings, various components of the apparatus are shown schematically in FIGS. 1 through 3. The frame for retaining the components and the various drive and control members are not shown. These Figures are for the purpose of showing the mutual position of the components and to indicate the motions thereof with respect to each other.

The apparatus includes a flat support 1, shown in frontal view in FIG. 1, which is rotatable around shaft 2 located in the plane of the drawing. The surface of the support 1 is normal to the plane of the drawing. Support 1 is provided on each of its surfaces with a photoconductive coating 3, 4 respectively. Both coatings 3 and 4 have the same characteristic properties. A pressure frame 5 is located above support 1 for pressing a light-transmitting color separation 6 firmly against the coating 3. The desired proof print will be made from separation 6.

A source of radiation 7 is provided for exposing the image of color separation 6 after the photoconductive coating thereof has been charged in the conventional manner. Charging of the coating of separation 6 is accomplished corona device 8 (FIGS. 2 and 3) which, when the frame 5 is tilted upwards in the direction indicated by arrows 9, can be moved over the surface of the coating 3.

Drum 11 is positioned beneath support 2 and is movable in the direction of the arrows 10. A receptor sheet onto which the toner image is to be transferred is positioned on drum 11.

A set of four toner holders 13–16 is positioned on the right-hand side of support 1 as viewed in FIG. 1. Holders 13–16 are retained in frame 12 which is shown schematically, and are filled with toner of different colors. Frame 12 is movable up and down in the direction of the arrows 17 to permit a selected toner holder to be moved out of the frame. The toner holder to be moved out of the frame is the one whose top edge lies below the level of the lowest photoconductive coating, shown by the dashed line 18 in FIG. 1. Said toner holder can move back and forth along the bottom of the photoconductive coating in the direction shown by arrow 19 so as to supply toner to the photoconductive coating.

A device 20 is positioned on the left-hand side of support 1 as viewed in FIG. 1 for removal of residual toner from the photoconductive coating. Device 20 includes a pair of rotary application rollers 22 mounted in a holder 21 which is filled with solvent, and a suction nozzle 23 arranged proximate thereto. These elements are combined with the toner solvent application device 40, which will be described in greater detail by reference to FIG. 6, to accurately apply a predetermined quantity of solvent to the photoconductive coating.

The movement of the various elements of the apparatus with respect to each other is illustrated by FIGS. 4a–4e which correspond with that of FIG. 1.

Referring first to the elements in the position illustrated in FIG. 4a, the exposure frame 5 is tilted upwards so that the corona arrangement 8 can be moved from left to right and back across the upper photoconductive surface 3. As a result, surface 3 is charged up to a predetermined potential. Next, a color separation 6 is placed on the surface and the frame 5 is closed and exposed to a vacuum to ensure good contact. Then, with the aid of the radiation source 7, as illustrated in FIG. 4b, the photoconductive coating 3 is image-wise exposed by the color separation 6.

Subsequently frame 5 is tilted upwards, the color separation 6 is removed and the support 1 is rotated through 180° around the shaft 2 which lies in the plane of the drawing. The coating 3 thereby is moved below and the coating 4 which has not yet been used is on top.

During the last step, the frame 12, together with toner carriages 13–16, has been brought to the correct height so that the toner carriage with toner of the desired color (for example, toner carriage 15) is located with its top edge level with the bottom edge of the coating 4. Toner carriage 14, the construction of which is described in greater detail below, is removed from the frame 12 by means of a suitable drive arrangement and moved in the direction of arrow 19 along the bottom of the exposed photoconductive coating. The coating 3 carries a latent charge image to enable toner to be applied to the charged surface portions of the coating. The toner feed operation for all of the partial images which are to be produced with the different color separations commences a selected period of time after the coating has been charged up to a predetermined final charge state which is identical for all partial images. Since the characteristics of both coatings 3 and 4 are identical, image formation for all partial images takes place under mutually identical circumstances.

Coincidental with development of the image present on the coating 3 by toner, the overlying coating 4 is charged up by means of the corona arrangement 8 to the same final charge state as employed previously for coating 3. This step is performed before the image-wise exposure of the coating by a second color separation. After toner is supplied, the toner image formed on coating 3 must be transferred to a receptor substrate. In the embodiment shown, a sheet of paper positioned on drum 11 is used by placement close to the coating. Thereafter, the paper (not shown) is unrolled along the coating. During this operation a new color separation 6' is placed on the top coating 4 and the coating 4 is exposed to the color separation 6' by radiation source 7.

After image transfer, the drum 11 is moved away from the bottom surface and the photoconductive coating 3 is cleaned with toner solvent to remove any residual toner. For this purpose, use is made of the arrangement 20 with two application brushes 22 arranged in rotary fashion in holder 21, and suction nozzle 23 which like the rollers 22 extend across the entire length of the coating. The applied solvent is removed by suction nozzle 23. Prior to being sucked away, an accurately determined quantity of solvent is applied to the coating 3 by means of the arrangement 40 (see FIG. 6). Before cleaning the coating, uniform exposure thereof can also be undertaken by means of a light source, not shown, so as to cause any residual charge to flow away.

Next, support 1 is rotated around shaft 2 thorugh 180° until it reaches the position illustrated in FIG. 4a and can again be charged up and exposed. The coating 4, which then carries a charge pattern corresponding to the color separation 6', is located on the underside of the support 1 and is developed using toner of the desired second color. Thereafter, the toner image is transferred to the substrate in registry with the first toner image.

The above operations are repeated with the other color separations so that ultimately, for each of the basic colors and possibly black, a toner image is formed on the substrate by means of which the proof print is completed.

The horizontal position of the photoconductive coating during the various operations facilitates not only the operation of the apparatus, especially the application of a color separation onto the charged coating, but also the application of toner onto the charged coating and the cleaning thereof with solvent.

FIG. 5 illustrates a cross-section of a preferred toner holder indicated generally by the reference numeral 25. The holder includes three application rollers 26, 27 and 28, rotatably mounted in a frame 29, which is mounted in holder 25 so as to be movable back and forth over a short distance in the direction shown by arrow 30. A plate 31 is mounted in insulated fashion between rollers 26 and 27, and has sharply tapered edges 32 and 33. A similar plate 34 with sharply tapered edges 35 and 36 respectively is mounted between rollers 27 and 28.

Plates 31 and 34 which, as previously stated are arranged in insulated fashion with respect to the housing 25, can be connected with a voltage source of suitable potential and polarity. The polarity of the voltage source is opposite to the toner polarity, so that a uniformly developed image is obtained during development of the charge pattern by application of toner in a known manner.

During movement of the holder 25 along the bottom of the photoconductive coating, the frame 29 with rollers 26, 27 and 28 is shifted to such an extent that during movement towards the left the roller 26 is located close to the edge 32 and the roller 27 is close to the edge 35. During return movement the roller 28 is close to the edge 36 and the roller 27 is close to the edge 33. As a result, the distance between roller and edge is precisely controlled so that an accurately predetermined quantity of toner, the level of which is indicated by reference number 37, is applied to the charged coating.

Figure 6:
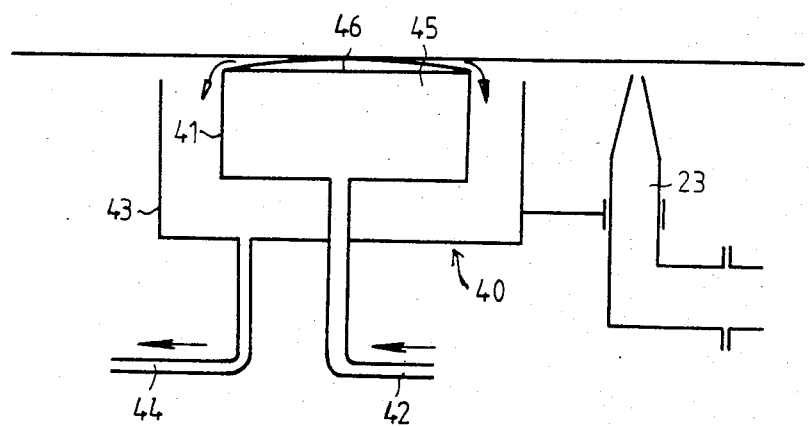
FIG. 6 is a schematic section of an arrangement for applying an accurately predetermined quantity of toner solvent to the photoconductive coating.

FIG. 6 schematically illustrates a section of a device for applying an accurately determined quantity of solvent to the coating, said device being combined with the suction nozzle 23.

The toner fluid feed arrangement 40 comprises an overflow chamber 41 connected to the toner fluid feed pipe 42 and retained in a holder 43 to which a toner fluid discharge pipe 44 is connected. The overflow chamber 41 is filled completely with toner fluid 45. This fluid has a meniscus 63, the height of which depends on fluid characteristics and which is a constant for a given fluid. Since the position of the photoconductive coating 3 during the various operations is fixed, by adjusting the spacing between the overflow chamber 41 with respect to this coating, the quantity of fluid which is fed to the coating can be very accurately controlled.

The whole assembly is guided along the coating. The excess toner applied by rollers 26, 27, 28 is sucked away by the nozzle 23. The photoconductive coating is moistened during return movement of the toner trolley to a predetermined extent by the toner fluid feed arrangement 40. The object of this treatment is to prevent uncontrolled flow of toner particles along the photoconductive surface during the stage in which toner is transferred to the receptor medium.

Figure 7:
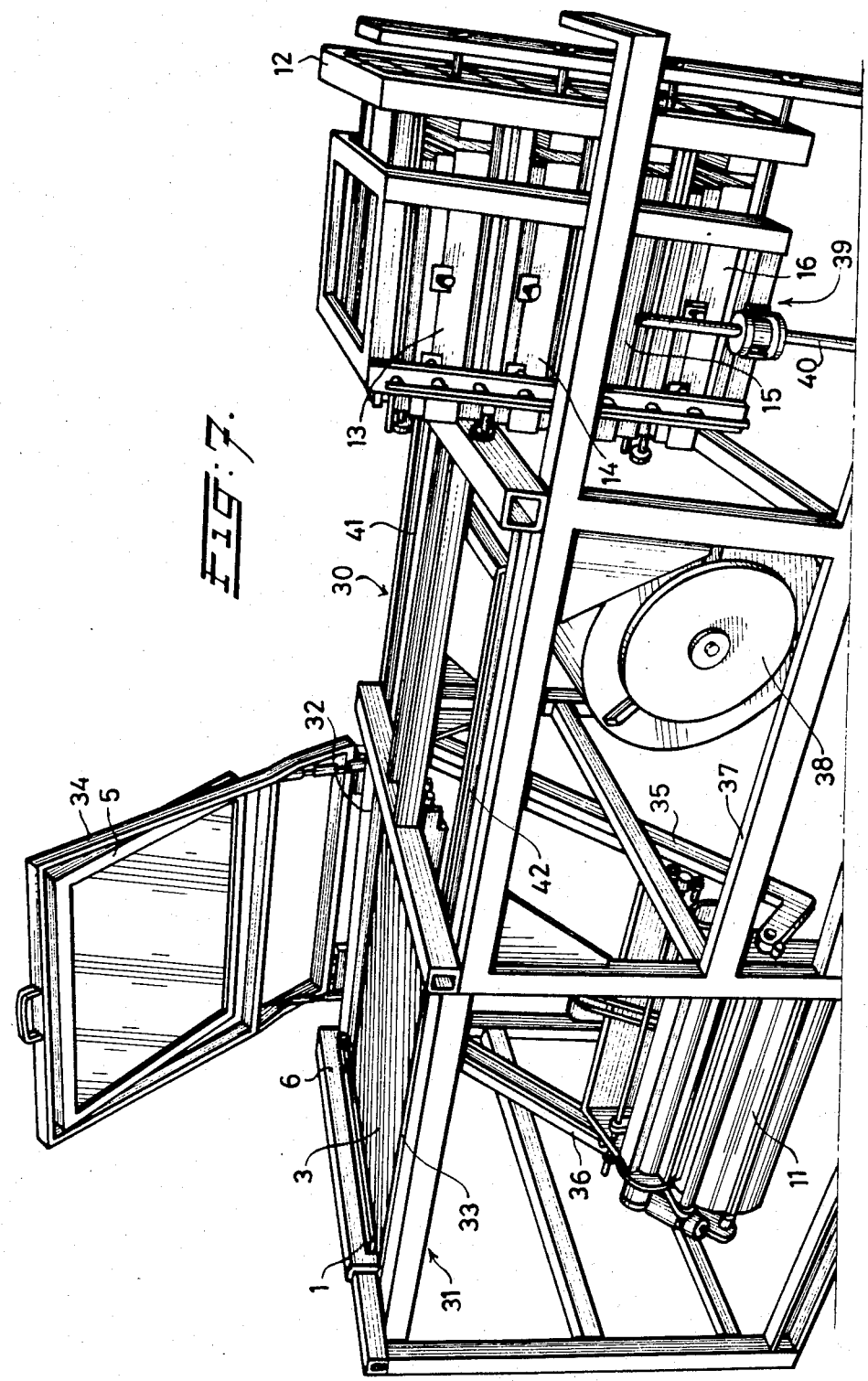
FIG. 7 is a perspective representation of a part of the arrangement.
Figure 8:
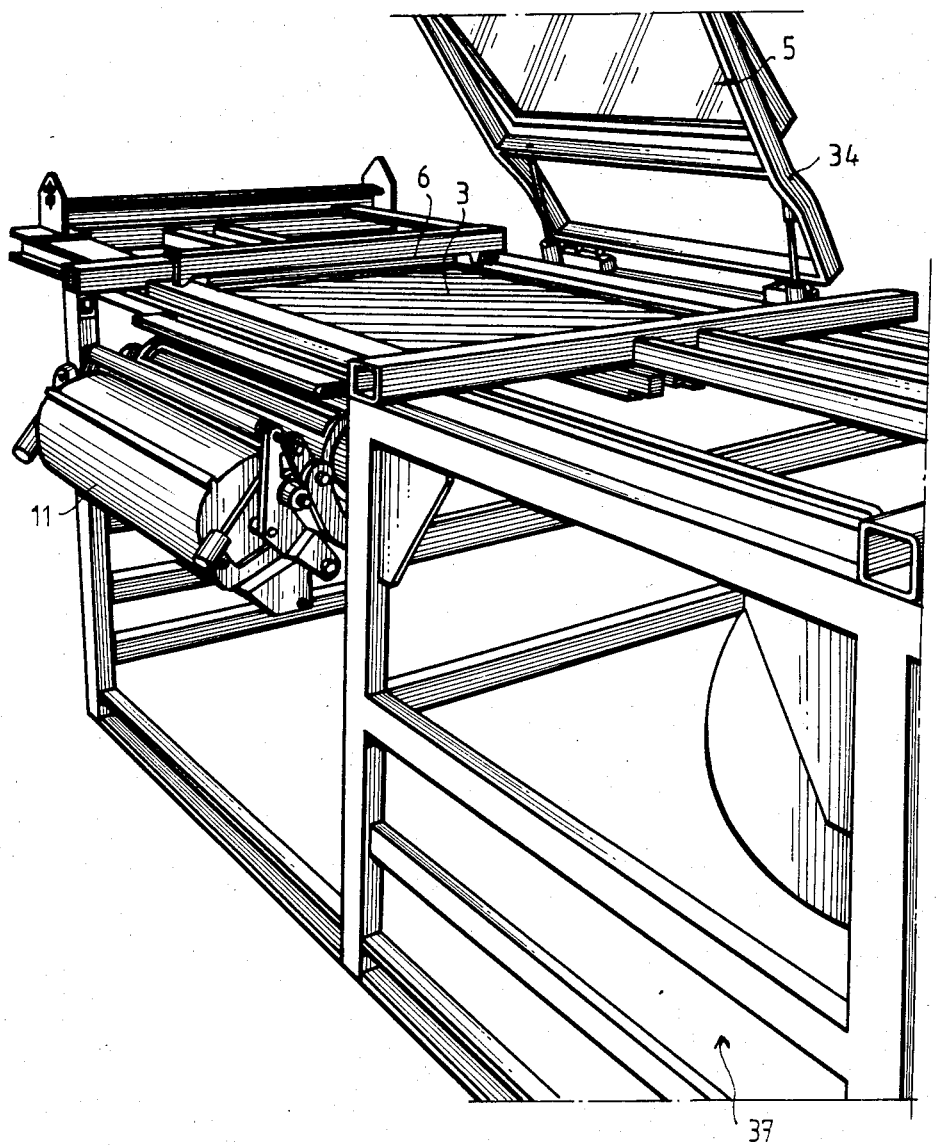
FIG. 8 is a perspective view of the left-hand portion of the arrangement in accordance with the invention.

FIG. 7 is a perspective view of part of the complete arrangement constructed in accordance with the invention. FIG. 8 is a perspective view of the portion of the apparatus with the support and photoconductive coating, and FIG. 9 is a perspective view showing the arrangement of the toner holders.

Referring to FIGS. 4a–4e, the cleaning unit 20 includes rollers 22, a suction nozzle identical with nozzle 23, and an arrangement identical with toner fluid feed arrangement 40. The cleaning rollers 22 function while moving from left to right. During their return movement, rollers 22 are adjusted downwardly, after which the suction nozzle and the fluid feed nozzle are activated. The frame in which the entire assembly is accommodated is indicated by reference numeral 30 in FIG. 7. The left-hand portion 31 accommodates the support 1 with the photoconductive coating thereof visible. The corona arrangement 8 is similarly shown; this is guided past the guides 32, 33 and can be moved back and forth across the coating 3 in the manner described previously. The frame 31 supports the pressure frame 5 accommodated in the tilting frame 34. Underneath the support 1 is the drum 11 for taking up the material on which the representation is to be formed, the said drum being mounted on arms 35, 36.

Different ancillary units are arranged in the middle portion of the frame 37, such as a drum 38 which contains the various pipelines for fluid and the supply and discharge of medium required for normal operation. Frame part 12 is formed on the right-hand portion of the frame 39 and retains the four toner holders 13–16. The frame 12 can be moved up and down by means of the threaded spindle 40 and brought to the desired level.

Figure 9:
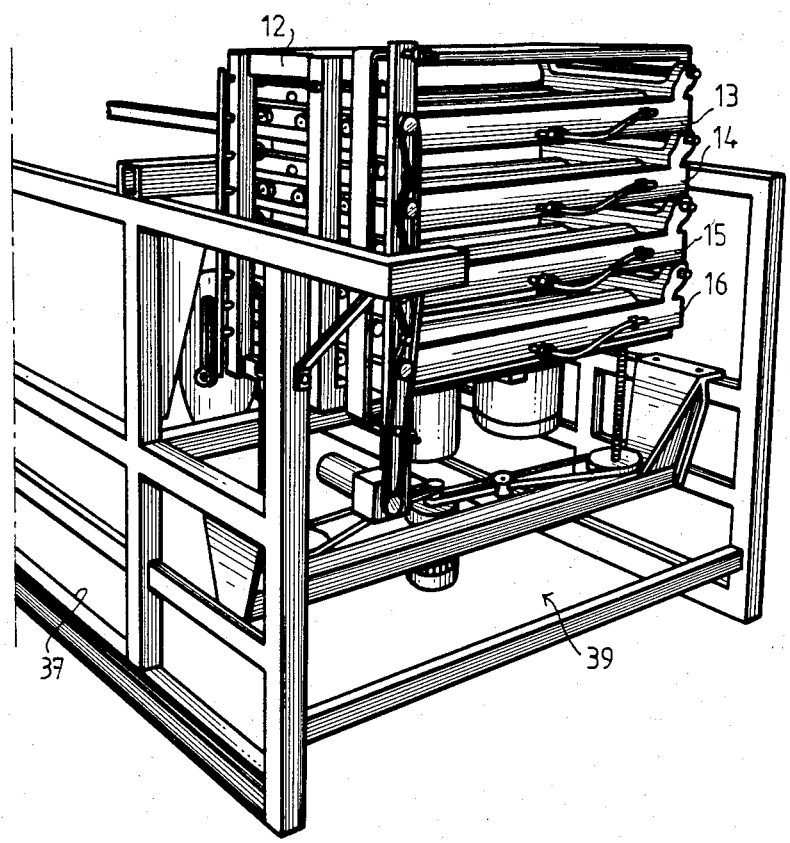
FIG. 9 gives a perspective view of the right-hand portion of this arrangement.

FIG. 9 illustrates additional details of the frame 12 with the four toner holders 13–16. A selected toner holder is guided in the guides 41, 42 of frame section 37 and can be brought in the manner described previously underneath the photoconductive coating.

Minor variations in the structure and other variations in the arrangement and size of the various parts may occur to those skilled in the art without departing from the spirit or circumventing the scope of the invention as set forth in the appended claims.

I claim:

1. Method for electrophotographically forming a multi-color proof print sequentially from at least two light transmitting color separations employing at least one electrophotographic recording member having a photoconductive coating that is capable of having an electrostatic charge applied thereto and possessed of a predetermined characteristic dark decay and wherein a charge pattern from each color separation is formed on the photoconductive surface by exposure of the said surface which has been charged to a predetermined charge state, the charge pattern being developed for a predetermined period after the charge state is achieved to form a toner image using toner having a color corresponding to a selected color separation and the toner image is transferred to a receptor surface such that the subsequently formed toner image is in registry therewith; said method comprising, charging the photoconductive coating to an identical final charge state before exposure for every color separation used and commencing development after the coating is charged to said final charge state.

2. The method as claimed in claim 1 in which developing is commenced at the same predetermined potential value along the dark decay for every toner image to be formed.

3. The method as claimed in claim 1 in which the average charge potential to which the photoconductive surface is charged is the same for each of the color images to be formed.

4. The method as claimed in claim 1, in which the photoconductive coating is charged to the same change state for each of all colors.

5. The method as claimed in claim 1 in which the duration of charging is the same for all colors.

6. Method as claimed in claim 1 and the additional step of forming the charge pattern during a period having the same duration for each toner image under identical charging conditions.

7. Method as claimed in claim 6 in which developing is performed during a period which is the same for each toner image.

8. Method as claimed in claim 7 in which the forming and developing periods are the same.

9. Method as claimed in claim 1 in which there are more than one photoconductive coated members, each having identical characteristics for formation thereon of a charge pattern.

10. Method as claimed in claim 9 in which the step of forming a charge pattern on one photoconductive coating is initiated during the step of developing a charge pattern on another photoconductive coating which has already been charged to a predetermined charge state.

11. Method as claimed in claim 1 in which a series of proof prints are prepared from the same original, the exposure for all color separations being effected with the same quantity of light.

12. Method as claimed in claim 1 including the step of moistening the photoconductive coating with a liquid toner dispersant prior to the application of toner.

13. Method as claimed in claim 1 including the step of moistening the surface of the photoconductive coating with a liquid electrically insulating solvent and subsequently removing the solvent by vacuum subsequent to transfer and prior to repeated step of forming a charge pattern.

14. Method as claimed in claim 1 including the step of exposing the photoconductive coating uniformly subsequent to transfer and prior to the repeated step of forming a charge pattern.

15. Method as claimed in claim 1 including the step of moistening the receptor surface with electrically insulating liquid prior to transfer and the additional step of drying the receptor surface subsequent to transfer.

16. A method of making multi-color prints from a series of color separation transparencies by electrophotographic imaging and transferring apparatus which comprises:
  A. charging the photoconductive coating of an electrophotographic member for a predetermined first period of time,
  B. producing from a first transparency a latent image on said charged coating by selectively exposing the coating to radiant energy,
  C. toning the latent image on said coating for a predetermined second period of time with a first toner,
  D. transferring the toned image to a receptor,
  E. repeating the series of steps A to D for at least another separation transparency using a different toner for said second transparency whereby to achieve a composite multiple toned image on the same said receptor,
  F. the repeated series of steps for each separation transparency and resulting transferred image being carried out at such speeds that at least the time interval between the start of the first and the start of the second period for each series of steps is substantially equal.

17. The method of claim 16 in which in addition to the said time intervals being equal, the first periods of each said series of steps are equal.

18. The method of claim 16 in which in addition to the said time intervals being equal, the second periods of each said series of steps are equal.

19. The method of claim 16 in which, in addition to the said time intervals being equal, the first periods of each series of steps are equal and the second periods of each series of steps are equal.

20. Apparatus for forming a multi-color proof print electrophotographically comprising a housing, a flat support with a photoconductive coating carried thereon and retained on said housing, means for charging said coating to a predetermined surface charge potential, means for exposing said charged photoconductive coating to form a latent charge image thereon, a plurality of toner holders each with different color toner supply means, means for moving selectively said toner holders individually with respect to the other respectively to interact with the photoconductive coating carrying a latent charge image thereon to form a visible toner image, a transfer medium including a receptor surface positioned proximate said toner image carrying photoconductive coating and means for effecting transfer of said toner image to said receptor surface, control means for said charging, exposure, toning and transfer means whereby the duration of charging is the same for all color images.

21. The apparatus as claimed in claim 20 in which the average surface voltage potential on the photoconductive coating is the same for every color image.

22. The apparatus as claimed in claim 20 in which the toning development is initiated at the same average charge voltage for every color image.

23. The apparatus as claimed in claim 20 in which the charge applied to the photoconductive coating is the same for every color image to be formed.

24. The apparatus as claimed in claim 20 in which development is initiated at the same average surface voltage for every color image to be formed.

25. The apparatus as claimed in claim 20 in which the duration of charging is the same for all toner images to be formed.

26. Apparatus as claimed in claim 20 in which said support is rotatably mounted upon a fixed shaft disposed parallel to said receptor surface, said support being rotatable from a first position at which the coating is charged and exposed to a second position which is 180° opposite to said first position, a magazine for supporting said toner holders arranged one above the other, and a drive mechanism operable for moving a selected toner holder from the magazine to a location proximate to said support for depositing toner on the exposed surface when in said second position and then back to the magazine.

27. Apparatus as claimed in claim 26 in which said support has a photoconductive coating on both sides thereof and is disposed in a horizontal plane in both said first and second positions, said means for charging and exposing the coating being positioned above the level of the support shaft, said means for effecting transfer of toner image being located below the level of the support shaft.

28. Apparatus as claimed in claim 20 in which each toner holder has a top face and a flat plate closing the face, the plates each having at least two slots formed transverse to the direction of movement of the holders, a toner transport roller mounted in each holder proximate to said slots, said rollers being rotatably movable in a direction opposite to the direction of movement of the holders, said rollers being operable to apply toner from the respective holder to said plate during movement thereof.

29. Apparatus as claimed in claim 28 in which said plates are electrically insulated with respect to the support and are operable as developing electrodes when brought to an electrical potential with respect to the support.

30. Apparatus as claimed in claim 29 in which said rollers can be displaced a short distance transverse to the axis thereof.

31. Apparatus as claimed in claim 28 including a doctor blade operable to clean the plate of each toner holder following application of toner thereof.

32. Apparatus as claimed in claim 20 including at least one solvent discharge and suction nozzle operable to pass over the width of the coating, said nozzle having a discharge aperture facing upwardly, the nozzle being retained in a frame movable back and forth in a generally horizontal direction beneath said coating.

33. Apparatus as claimed in claim 20 including a solvent holder movable back and forth in a generally horizontal direction beneath the coating, at least one solvent application roller rotatably mounted a small distance above the solvent holder, an open top overflow chamber coupled with the solvent holder and mounted for movement over the photoconductive coating, a solvent supply conduit for supplying solvent from the holder to said chamber, and a suction nozzle operable to pass over the coating.

34. Apparatus for multi-color imaging by electrophotographic techniques which includes disposing an electrophotographic member having a photoconductive coating in position to be charged, charging the coating, producing from a first separation transparency a latent image on said charged coating by selectively exposing the coating to radiant energy, toning the latent image, transferring the toned image to a receptor and repeating the process for at least another of the separation transparencies and another toner but for the same receptor, which comprises:

A. housing means for supporting an electrophotographic member having a photoconductive coating in a first position relative to said housing means to be charged and imaged through a separation transparency to produce a latent image on said coating, B. means for charging said coating for a predetermined period of time, while the photoconductive coating is in the first position, C. means for moving the electrophotographic member to a second position relative to said housing means in which its photoconductive coating faces a different aspect than when at said first position, D. means for toning said latent image while said electrophotographic member is in said second position, E. means for transferring the toned image from the photoconductive coating to a receptor, F. means for returning said electrophotographic member from said second to first position to enable a repetition of said charging, imaging, toning and transfer sequence with at least a second separation transparency to apply a second toned image onto the previous image applied to said receptor, G. said toning means comprising i. a plurality of carriages, each constructed and arranged to carry and apply a different toner to respective latent images repeatedly formed on said electrophotographic member when said member is in said second position, ii. means defining a predetermined path for movment of a carriage in a timed cycle to effect said application and iii. means for bringing a selected one of said carriages to said path exclusive of all other carriages and causing said one carriage to execute said cycle when the latent image to be toned by the toner of said one carriage is at said second position.

35. The apparatus as claimed in claim 34 in which the toning means additionally comprise a magazine in said housing having all of said carriages disposed in said magazine and the means for bringing a selected one of said carriages to said path are constructed to select a carriage in said magazine, to remove it from the magazine, to cause it to execute said cycle and thereafter to return the carriage to said magazine.

36. The apparatus as claimed in claim 34 in which said toning means additionally comprise a magazine in said housing having all of said carriages disposed in said magazine, said means for bringing a selected one of said carriages to said path being associated with said magazine and including structure for aligning the selected one of said carriages with said path, and the means for causing the carriage to execute said cycle comprise a drive mechanism adapted to be coupled to said selected carriage, driving same through said cycle and adapted thereafter to enable subsequent coupling to a different selected carriage.

37. The apparatus as claimed in claim 34 in which said toning means additionally comprise an elevator in said housing and the bringing and causing means comprise an elevator drive for raising and lowering the elevator to align a selected carriage with said path.

38. The apparatus as claimed in claim 37 in which the bringing and causing means include a carriage drive, means for coupling said selected carriage to said drive when so aligned with said path and operating said drive to effect said cycle uncoupling said drive when the cycle is complete.

39. The apparatus as claimed in claim 37 in which said coupling means are electromagnetic.

40. The apparatus as claimed in claim 34 in which each carriage includes a sump for liquid toner, toner transport means in said sump and a flow member having a flat wash surface adapted to be brought into toner applying position during said cycle, the transport means being adapted while the carriage is in said cycle, to bring toner from the sump and apply it to said wash surface.

41. The apparatus as claimed in claim 40 in whcih the transport means include two rollers adapted to rotate with movement of the carriage at opposite edges of the flow member each being effective when the carriage is moving in one direction whereby the wash surface is provided with toner by one roller as the carriage moves in one direction and is provided with toner by the other roller when the carriage moves in the opposite direction.

42. In an apparatus for imaging by electrophotographic techniques in which there is a carriage which is reciprocated back and forth relative to the photoconductive surface of an electrophotographic member, the photoconductive surface facing generally downward and adapted to have a latent image thereon to be toned, the carriage movement being effective to tone said latent image, the invention herein which comprises:

A. a toning carriage adapted to be reciprocated along a generally horizontal path and having a sump for liquid toner, B. toner transport means in said sump and a flow member in said carriage have the sump having at least a flat upwardly facing wash surface extending generally transverse of the direction of carriage reciprocation and the wash surface having a forward edge and a rearward edge, said flow member adapted to be brought into toner applying position relative to said photoconductive surface during said reciprocation, the transport means being adapted, while the carriage is moving to bring toner from the sump and lift same onto said wash surface, C. said transport means including two toner lifting devices at respective forward and rearward edges of the wash surface, each operative exclusive of the other to lift toner and apply said toner to said surface moving in one direction.

43. The invention as claimed in claim 42 in which the toner lifting devices comprise rollers rotating in said sump on axes parallel with said wash surface edges, each roller being spaced from its associated edge when the opposite roller as contiguous to its associated edge and vice versa, whereby toner is lifted by a roller only when that roller is contiguous to its associated edge.

44. The invention as claimed in claim 43 in which the rollers are mounted on a frame with their axes fixed relative to one another so as to be moved together.

45. The invention as claimed in claim 42 in which said carriage has a plurality of wash surfaces, there being a lifting device associated with each forward and rearward edge of each of said surfaces.

46. The invention as claimed in claim 45 in which adjacent wash surfaces have a common toner lifting device serving the forward edge of one and the rearward edge of the other.

* * * * *